United States Patent
Jeong et al.

(10) Patent No.: US 8,031,004 B2
(45) Date of Patent: Oct. 4, 2011

(54) ACTIVE BALUN WITH STACKED STRUCTURE

(75) Inventors: Moon Suk Jeong, Gyunggi-do (KR); Yoo Sam Na, Seoul (KR)

(73) Assignee: Samsung Electro-Mechanics Co., Ltd., Gyunggi-do (KR)

(*) Notice: Subject to any disclaimer, the term of this patent is extended or adjusted under 35 U.S.C. 154(b) by 0 days.

(21) Appl. No.: 12/646,351

(22) Filed: Dec. 23, 2009

(65) Prior Publication Data
US 2011/0037522 A1 Feb. 17, 2011

(30) Foreign Application Priority Data
Aug. 11, 2009 (KR) .................. 10-2009-0073891

(51) Int. Cl.
*H03F 3/04* (2006.01)
(52) U.S. Cl. ........................................ 330/301
(58) Field of Classification Search .................. 330/301, 330/252–261, 310–311; 333/25–26
See application file for complete search history.

(56) References Cited

U.S. PATENT DOCUMENTS

| | | | |
|---|---|---|---|
| 4,897,615 A | 1/1990 | Chen et al. | |
| 5,867,061 A * | 2/1999 | Rabjohn et al. | 330/124 R |
| 6,133,793 A * | 10/2000 | Lau et al. | 330/302 |
| 7,193,475 B2 * | 3/2007 | Su et al. | 330/301 |

* cited by examiner

*Primary Examiner* — Hieu Nguyen
(74) *Attorney, Agent, or Firm* — Lowe, Hauptman, Ham & Berner, LLP

(57) ABSTRACT

An active balun with a stacked structure includes: a first amplification unit including a first transistor having a first terminal connected with a first input terminal, a second terminal connected with a power voltage terminal, and a third terminal connected with an output terminal; a second amplification unit including a second transistor having a first terminal connected with a second input terminal, a second terminal connected with the output terminal, and a third terminal connected with a ground; and a capacitance matching unit connected between the first terminal and the third terminal of the first transistor and having a pre-set matching capacitance.

6 Claims, 3 Drawing Sheets

ACTIVE BALUN WITH STACKED STRUCTURE

CROSS-REFERENCE TO RELATED APPLICATIONS

This application claims the priority of Korean Patent Application No. 10-2009-0073891 filed on Aug. 11, 2009, in the Korean Intellectual Property Office, the disclosure of which is incorporated herein by reference.

BACKGROUND OF THE INVENTION

1. Field of the Invention

The present invention relates to an active balun with a stacked structure and, more particularly, to an active balun with a stacked structure capable of compensating for an imbalance in parasitic capacitance of a common drain (CD) MOS transistor and that of a common source (CS) MOS transistor included in the stacked structure, to thereby prevent signal distortion and guarantee linearity.

2. Description of the Related Art

In general, an analog transmitter receives an in-phase (I) signal and a quadrature-phase (Q) signal which has been generated by converting a digital signal received from a modem into an analog signal by using a digital analog converter (DAC). This means that the digital signal carrying information is divided into an analog signal of a real number part and an analog signal of an imaginary number part, which are then transmitted. The transmission signals are transferred in the form of differential signals including I and Q signals to a circuit constituting a transmitter system.

Recently, in a direct conversion scheme most commonly used for the structure of the transmitter system, a differential-to-single circuit is largely disposed between an up-mixer and a drive amplifier or behind the driver amplifier, so as to be used. When the differential-to-single circuit is used between the up-mixer and the drive amplifier, the driver amplifier can be implemented as a single-ended type driver amplifier, advantageously reducing power consumption, and when the differential-to-single circuit is used behind the drive amplifier, the number of baluns used as external elements and other components can be halved to advantageously lower product unit cost.

With regard to this configuration, however, in the former case, the gain, linearity and oscillation performance of the transmitter may deteriorate, and in the latter case, the drive amplifier must be implemented as a differential type amplifier, consuming a great deal of current as compared with the former case. The differential-to-single circuit is positioned at the rear side among unit blocks constituting the transmitter system, so it must be designed to satisfy the performance required by the transmitter even if performance in areas such as linearity is degraded as mentioned above.

The related art active balun, which converts a differential signal into a single signal, has a structure in which the differential signal is converted into the single signal by circuitry within a chip as well as a structure in which the balun, an external element, is used outside a chip. In the case of the active balun having a stacked structure including a common drain MOS transistor and a common source MOS transistor, two input signals are combined into a single signal after respectively passing through the single-ended amplifier, so wideband frequency characteristics can be obtained while reducing current consumption.

However, the related art active balun having the stacked structure including the common drain MOS transistor and the common source MOS transistor has a problem in that the parasitic capacitances of the respective input transistors viewed from the single output are different, making the two input signals have different levels.

SUMMARY OF THE INVENTION

An aspect of the present invention provides an active balun with a stacked structure capable of compensating for an imbalance in parasitic capacitance of a common drain (CD) MOS transistor and that of a common source (CS) MOS transistor included in the stacked structure, to thereby prevent signal distortion and guarantee linearity.

According to an aspect of the present invention, there is provided an active balun with a stacked structure including: a first amplification unit including a first transistor having a first terminal connected with a first input terminal, a second terminal connected with a power voltage terminal, and a third terminal connected with an output terminal; a second amplification unit including a second transistor having a first terminal connected with a second input terminal, a second terminal connected with the output terminal, and a third terminal connected with a ground; and a capacitance matching unit connected between the first terminal and the third terminal of the first transistor and having a pre-set matching capacitance.

The first transistor may be a PMOS transistor of which the first terminal is a gate, the second terminal is a drain, and the third terminal is a source, wherein the second transistor may be a PMOS transistor of which the first terminal is a gate, the second terminal is a drain, and the third terminal is a source.

The capacitance matching unit may include a matching capacitor connected between the gate and the source of the first transistor to provide the matching capacitance, and the matching capacitance of the matching capacitor may correspond to a capacitance error between a parasitic capacitance between the gate and the source of the first transistor and a parasitic capacitance between the gate and the drain of the second transistor.

According to another aspect of the present invention, there is provided an active balun with a stacked structure including: a first amplification unit including a PMOS type first transistor having a gate connected with a first input terminal and a first bias voltage terminal through a resistor, a drain connected with a power voltage terminal, and a source connected with an output terminal; a second amplification unit including a PMOS type second transistor having a gate connected with a second input terminal and a second bias voltage terminal through a resistor, a drain connected with the output terminal, and a source connected with a ground; and a capacitance matching unit connected between the gate and the source of the first transistor and having a pre-set matching capacitance.

The capacitance matching unit may include a matching capacitor connected between the gate and the source of the first transistor to provide the matching capacitance, wherein the matching capacitance of the matching capacitor may correspond to a capacitance error between a parasitic capacitance between the gate and the source of the first transistor and a parasitic capacitance between the gate and the drain of the second transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
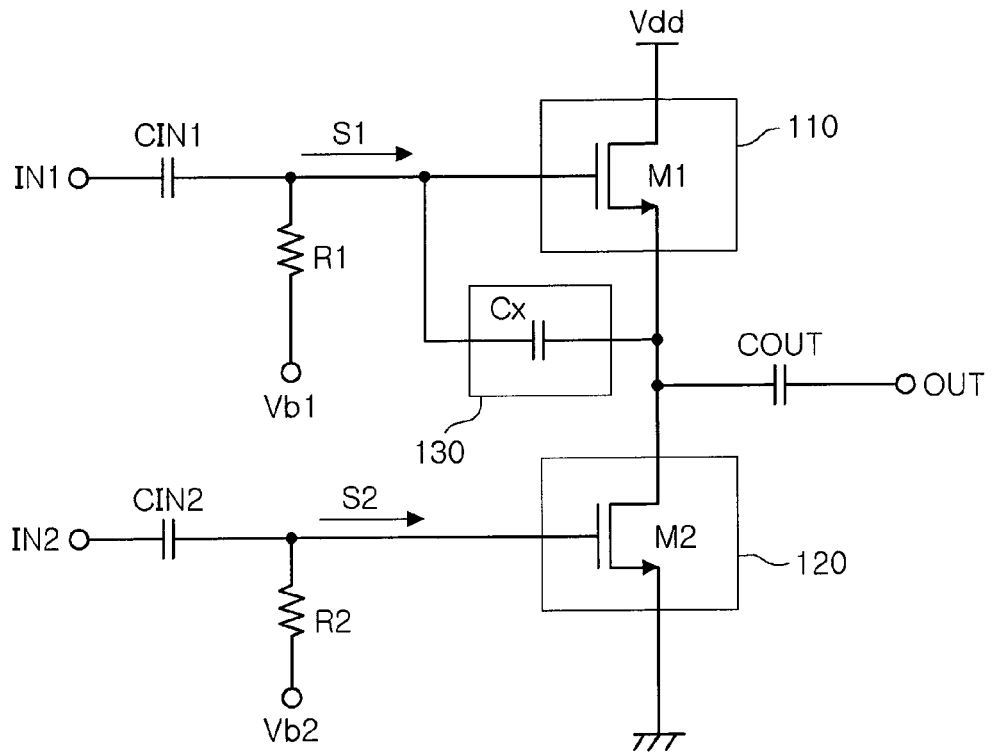
FIG. 1 is circuit diagram of an active balun with a stacked structure according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is circuit diagram of an active balun with a stacked structure according to an exemplary embodiment of the present invention.

With reference to FIG. 1, the active balun with a stacked structure according to an exemplary embodiment of the present invention includes a first amplification unit 110 including a first transistor M1 having a first terminal connected with a first input terminal IN1, a second terminal connected with a power voltage terminal Vdd, and a third terminal connected with an output terminal OUT; a second amplification unit 120 including a second transistor M2 having a first terminal connected with a second input terminal IN2, a second terminal connected with the output terminal OUT, and a third terminal connected with a ground; and a capacitance matching unit 130 connected between the first terminal and the third terminal of the first transistor M1 and having a pre-set matching capacitance.

The first transistor M1 may be a PMOS transistor in which the first terminal is a gate, the second terminal is a drain, and the third terminal is a source, and the second transistor M2 may be a PMOS transistor in which the first terminal is a gate, the second terminal is a drain, and the third terminal is a source.

With reference to FIG. 1, the active balun with a stacked structure includes the first amplification unit 110 including the PMOS type first transistor M1 having the gate connected with the first input terminal IN1 and a first bias voltage terminal Vb1 through a resistor R1, the drain connected with the power voltage terminal, and a source connected with the output terminal OUT; the second amplification unit 120 including the PMOS type second transistor M2 having the gate connected with the second input terminal IN2 and a second bias voltage terminal Vb2 through a resistor R2, the drain connected with the output terminal OUT, and the source connected with the ground; and the capacitance matching unit 130 connected between the gate and the source of the first transistor M1 and having a pre-set matching capacitance.

Figure 2:
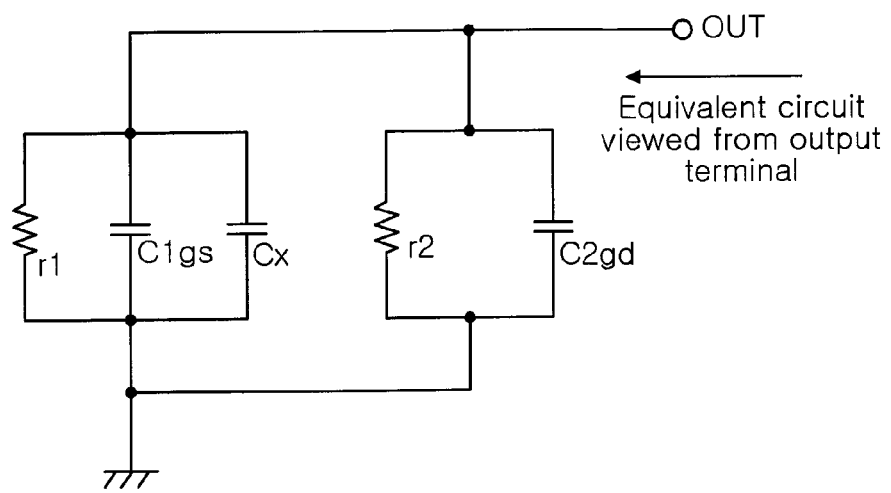
FIG. 2 illustrates an equivalent circuit viewed from an output terminal of the active balun with a stacked structure according to an exemplary embodiment of the present invention.

FIG. 2 illustrates an equivalent circuit viewed from the output terminal of the active balun with a stacked structure according to an exemplary embodiment of the present invention.

With reference to FIGS. 1 and 2, the capacitance matching unit 130 includes a matching capacitor Cx connected between the gate and the source of the first transistor M1 to provide the matching capacitance.

The matching capacitance of the matching capacitor Cx corresponds to a capacitance error between a parasitic capacitance C1$gs$ between the gate and the source of the first transistor M1 and a parasitic capacitance C2$gd$ between the gate and the drain of the second transistor M2. That is, the matching capacitance of the matching capacitor Cx is set to be equal with the capacitance error.

Figure 3:
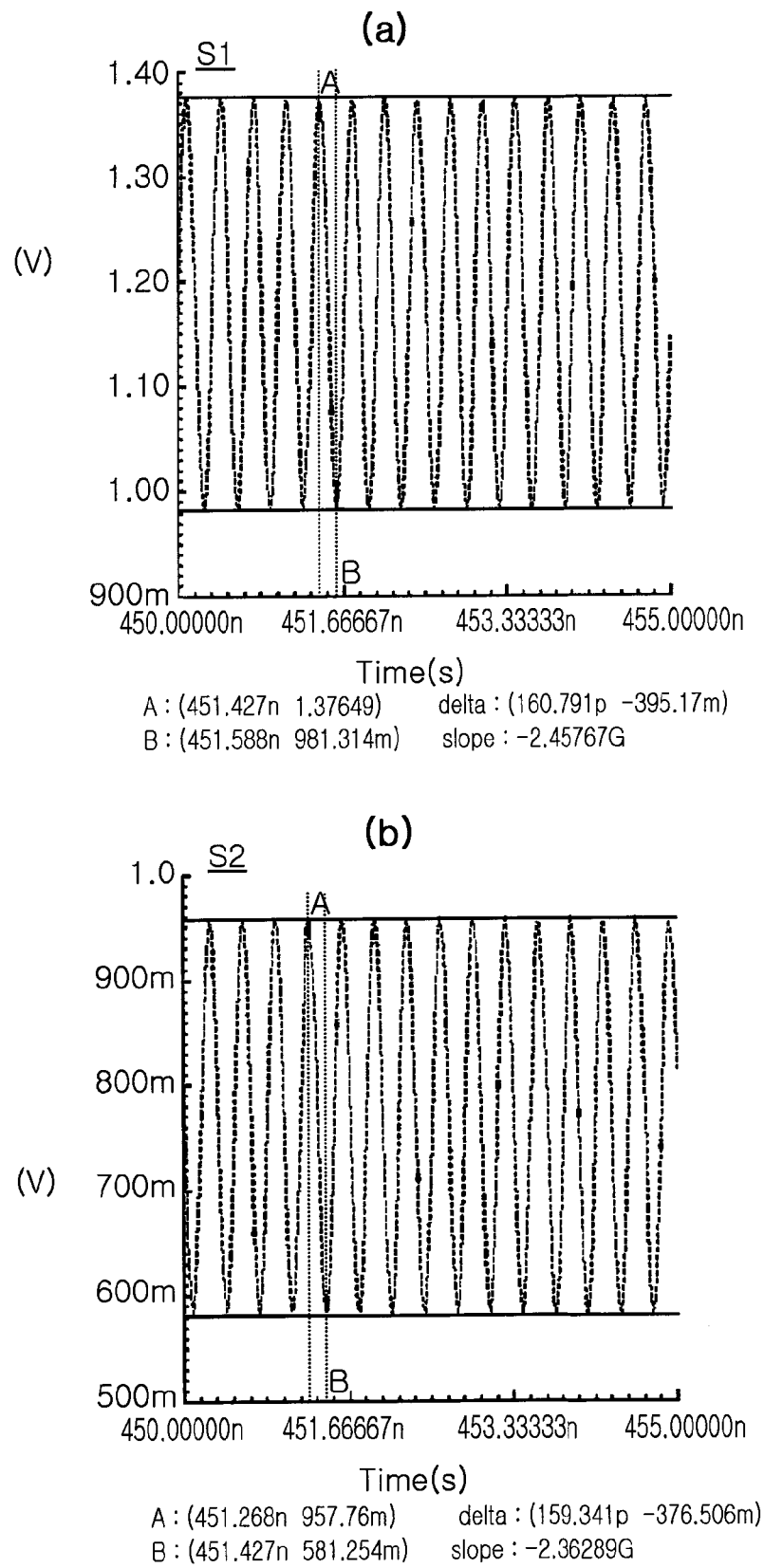
FIG. 3 illustrates waveforms of first and second input signals in case of the absence of a capacitance matching unit.

FIG. 3 illustrates waveforms of first and second input signals in the case of the absence of a capacitance matching unit. In FIG. 3, S1 shows the waveforms of a first input signal input to the gate of the first transistor when the capacitance matching unit is removed, and S2 shows the waveforms of a second input signal input to the gate of the second transistor when the capacitance matching unit is removed.

Point A denotes a +peak point, while point B denotes −peak point. Delta denotes the difference between the points A and B. Slope denotes a tilt of the signal waveform.

Figure 4:
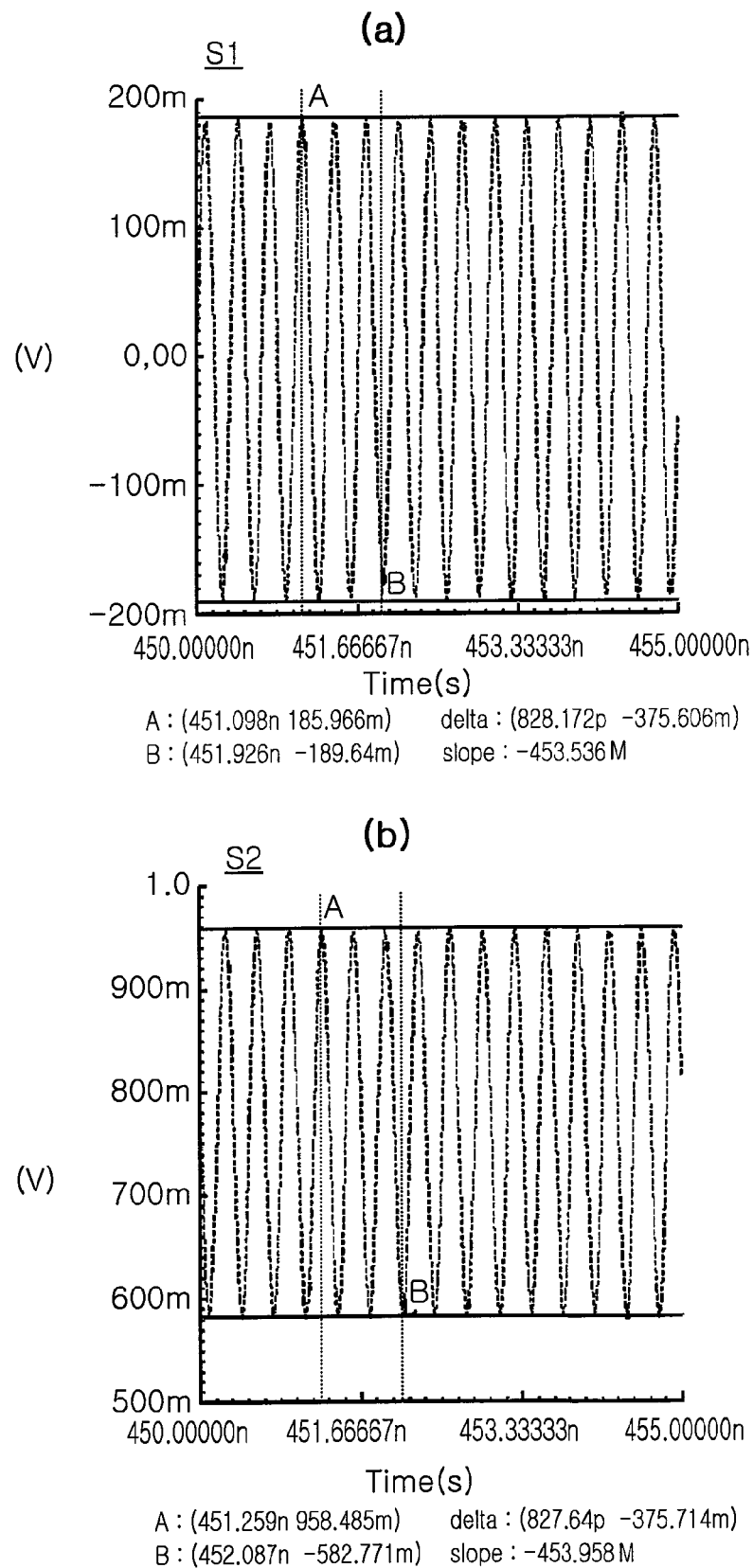
FIG. 4 illustrates waveforms of first and second input signals in case of the presence of a capacitance matching unit.

FIG. 4 illustrates waveforms of first and second input signals in case of the presence of a capacitance matching unit. In FIG. 4, S1 shows the waveform of a first input signal input to the gate of the first transistor when the capacitance matching unit is present, and S2 shows the waveform of a second input signal input to the gate of the second transistor when the capacitance matching unit is present.

Point A denotes a +peak point, while point B denotes a −peak point. Delta denotes the difference between the points A and B. The slope denotes a tilt of the signal waveform.

The operation and effects of the present invention will now be described with reference to the accompanying drawings.

The active balun with the stacked structure according to an exemplary embodiment of the present invention will now be described with reference to FIGS. 1 to 4. With reference to FIG. 1, the active balun according to an exemplary embodiment of the present invention includes the first amplification unit 110 having the first transistor M1, the second amplification unit 120 including the second transistor M2, and the capacitance matching unit 130 connected between the first and third terminals of the first transistor M1 and having a pre-set matching capacitance.

In detail, as shown in FIG. 1, the first transistor M1 may be a PMOS transistor in which the first terminal is a gate, the second terminal is a drain, and the third terminal is a source. The second transistor M2 may be a PMOS transistor in which the first terminal is a gate, the second terminal is a drain, and the third terminal is a source. In this case, the first and second transistors M1 and M2 are configured as shown in FIG. 1.

Because an output DC voltage is determined by the first and second bias voltages Vb1 and Vb2 connected with the gates of the first and second transistors M1 and M2, respectively, in order to determine the linearity of the active balun according to the present invention, the first and second bias voltages Vb1 and Vb2 are previously set as values satisfying the linearity.

The first input signal S1 input through the first input terminal IN1 is input to the gate of the first transistor M1 and then transferred to the source of the first transistor M1. A second input signal S2 input through the second input terminal IN2 is input to the gate of the second transistor M2 and then transferred to the drain of the second transistor M2.

Here, the first and second input signals S1 and S2 are differential signals having a phase difference of 180 degrees. The first and second input signals S1 and S2 are combined at the output terminal OUT connected to a connection node of the source of the first transistor M1 and the drain of the second transistor M2.

Referring to the pass path of the first and second input signals S1 and S2, a gate-source parasitic capacitance exists in the pass path of the first input signal S1, and a gate-drain parasitic capacitance exists in the pass path of the second input signal S2.

In this respect, in terms of a general MOS transistor, the parasitic capacitance Cgs between the gate and the source of the MOS transistor is far smaller than the parasitic capacitance Cgd between the gate and the drain of the MOS transistor. Thus, in FIG. 1, the parasitic capacitance C1gs between the gate and the source of the first transistor M1 is far smaller than the parasitic capacitance C2gd between the gate and the drain of the second transistor M2 (C1gs<<C2gd).

In this situation, if the capacitance matching unit 130 is removed, the capacitances C1gs and C2gd of the first and second transistors would be imbalanced to distort the first input signal S1 input to the gate of the first transistor M1 and the second input signal S2 input to the gate of the first transistor M1 as shown in FIG. 3, resulting in a situation wherein the peak-peak voltage sizes and tilts are not balanced.

Namely, as for the points A and B of each of the first and second input signals S1 and S2 in FIG. 3, delta corresponding to the difference between the points A and B of the first input signal S1 is 395.171 mV, and delta corresponding to the difference between the points A and B of the second input signal S2 is 376.506 mV, showing that the difference between the delta values is as large as about 18.6 mV and that the first and second input signals S1 and S2 are distorted to be imbalanced.

In summary, when the sizes of the first and second transistors M1 and M2 are the same, real number values of input impedance existing on the pass path of the first and second input signals S1 and S2 viewed from the output terminal are equal, but because the parasitic capacitance values differ, the imaginary number values of the input impedance are changed. The difference in the imaginary number values of the input impedance alters the sizes of the first and second input signals S1 and S2 respectively input to the gates of the first and second transistors M1 and M2 to cause the signal distortion. Therefore, if the imaginary number values of the first and second input signals are equal, the first and second input signals S1 and S2 having the phase difference of 180 degrees could be outputted without any distortion or loss. This will now be described.

With reference back to FIG. 1, when the capacitance matching unit 130 is connected between the gate and the source of the first transistor M1 to provide the pre-set matching capacitance Cx, the parasitic capacitance C1gs between the gate and the source of the first transistor M1 is combined in parallel with the matching capacitance Cx, increasing the sum capacitance C1gs//Cx which is equal to the parasitic capacitance C2gd between the gate and the drain of the second transistor M2 ([C1gs//Cx]□C2gd).

FIG. 2 shows the impedance equivalent circuit viewed from the output terminal of the active balun according to an exemplary embodiment of the present invention, in which r1 and r2, namely, the real number values of impedance, are set to be equal by using the first and second transistors M1 and M2 having the same size.

In this case, in the presence of the capacitance matching unit 130 according to an exemplary embodiment of the present invention, the imbalance between the parasitic capacitance of the first transistor M1 and that of the second transistor M2 is removed by the capacitance matching unit 130, so the first input signal S1 input to the gate of the first transistor M1 and the second input signal S2 input to the gate of the second transistor M2 can be balanced in their peak-peak voltage size and tilt without distortion as shown in FIG. 4.

Namely, referring to points A and B of each of the first and second input signals S1 and S2 in FIG. 4, the delta corresponding to the difference between points A and B of the first input signal S1 is 375.606 mV and the delta corresponding to the difference between points A and B of the second input signal S2 is 375.714 mV, merely making the difference of the delta value of about 0.1 mV, which shows that there is not any substantial difference between the delta values. Accordingly, it is noted that the first and second input signals S1 and S2 are balanced without any distortion.

In the exemplary embodiment of the present invention as described above, the active balun with the stacked structure is driven with a smaller amount of current has the wideband frequency characteristics, and has the matching capacitor to compensate the capacitance in order to output two input signals having a phase difference of 180 degrees without distortion and a loss. Thus, the active balun according to the present invention can have the maximum linear characteristics required for the output terminal of the transmitter system.

As set forth above, according to exemplary embodiments of the invention, in the stacked structure including the CD MOS transistor and the CS MOS transistor, the imbalance in the parasitic capacitances of the two MOS transistors are compensated for. Thus, a signal distortion can be prevented and linearity can be guaranteed.

While the present invention has been shown and described in connection with the exemplary embodiments, it will be apparent to those skilled in the art that modifications and variations can be made without departing from the spirit and scope of the invention as defined by the appended claims.

What is claimed is:

1. An active balun with a stacked structure, comprising:
first and second input terminals;
a power voltage terminal;
an output terminal;
a first amplification unit including:
a first transistor having:
a first terminal connected with the first input terminal,
a second terminal connected with the power voltage terminal, and
a third terminal connected with the output terminal;
a second amplification unit including:
a second transistor having:
a first terminal connected with the second input terminal,
a second terminal connected with the output terminal, and
a third terminal connected with the ground; and
a capacitance matching unit directly connected between the first terminal and the third terminal of the first transistor and having a pre-set matching capacitance that compensates for an imbalance in parasitic capacitance between the first and second transistors.

2. The active balun of claim 1, wherein the first transistor is a PMOS transistor of which the first terminal is a gate, the second terminal is a drain, and the third terminal is a source.

3. The active balun of claim 2, wherein the second transistor is a PMOS transistor of which the first terminal is a gate, the second terminal is a drain, and the third terminal is a source.

4. The active balun of claim 3, wherein the capacitance matching unit comprises:

a matching capacitor directly connected between the gate and the source of the first transistor to provide the pre-set matching capacitance, wherein the pre-set matching capacitance of the matching capacitor corresponds to a capacitance error between a parasitic capacitance between the gate and the source of the first transistor and a parasitic capacitance between the gate and the drain of the second transistor.

5. An active balun with a stacked structure, comprising:

first and second input terminals;

first and second bias voltage terminals;

a power voltage terminal;

an output terminal;

first and second resistors;

a first amplification unit including:
- a PMOS type first transistor having:
  - a gate connected with the first input terminal, said gate also connected with the first bias voltage terminal through the first resistor,
  - a drain connected with the power voltage terminal, and
  - a source connected with the output terminal;

a second amplification unit including:
- a PMOS type second transistor having:
  - a gate connected with the second input terminal, said gate also connected with the second bias voltage terminal through the second resistor,
  - a drain connected with the output terminal, and
  - a source connected with the ground; and
- a capacitance matching unit directly connected between the gate and the source of the PMOS type first transistor and having a pre-set matching capacitance that compensates for an imbalance in parasitic capacitance between the PMOS type first and PMOS type second transistors.

6. The active balun of claim 5, wherein the capacitance matching unit comprises:

a matching capacitor directly connected between the gate and the source of the PMOS type first transistor to provide the pre-set matching capacitance, wherein the pre-set matching capacitance of the matching capacitor corresponds to a capacitance error between a parasitic capacitance between the gate and the source of the PMOS type first transistor and a parasitic capacitance between the gate and the drain of the PMOS type second transistor.

* * * * *